(12) United States Patent
Qiao

(10) Patent No.: US 9,748,700 B2
(45) Date of Patent: Aug. 29, 2017

(54) EMI GASKET

(75) Inventor: YunLong Qiao, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 425 days.

(21) Appl. No.: 13/700,234

(22) PCT Filed: Jun. 7, 2011

(86) PCT No.: PCT/US2011/039419
§ 371 (c)(1),
(2), (4) Date: Nov. 27, 2012

(87) PCT Pub. No.: WO2011/156354
PCT Pub. Date: Dec. 15, 2011

(65) Prior Publication Data
US 2013/0072063 A1    Mar. 21, 2013

(30) Foreign Application Priority Data

Jun. 9, 2010 (SG) .................................. 201004033

(51) Int. Cl.
*H01R 13/658* (2011.01)
*H05K 9/00* (2006.01)
*H01R 13/74* (2006.01)

(52) U.S. Cl.
CPC ..... *H01R 13/65802* (2013.01); *H05K 9/0058* (2013.01); *H01R 13/745* (2013.01)

(58) Field of Classification Search
CPC ............ H01R 13/65082; H01R 13/745; H05K 9/0058
(Continued)

(56) References Cited

U.S. PATENT DOCUMENTS 6,095,862 A * 8/2000 Doye et al. .............. 439/607.11
6,206,730 B1 * 3/2001 Avery et al. ............. 439/607.18
(Continued)

FOREIGN PATENT DOCUMENTS

EP     1 026 786     8/2000
WO    WO 98/02940   1/1998
(Continued)

OTHER PUBLICATIONS

PCT International Search Report for PCT/US2011/039419 dated Feb. 9, 2012, 3 pages.

*Primary Examiner* — Alexander Gilman
(74) *Attorney, Agent, or Firm* — Robert S. Moshrefzadeh

(57) ABSTRACT

A gasket for use with an electromagnetic interference (EMI) shielding cage for a connector includes a conductive body having an opening configured to receive a first end of the EMI shielding cage near a gasket mating wall incorporated on the EMI shielding cage. The conductive body has a first face designed to face away from the gasket mating wall, a second face designed to face the gasket mating wall, an inner perimeter and an outer perimeter. A plurality of engagement tabs are disposed along the outer perimeter and extend away from the first face. A plurality of spring tabs are disposed along the inner perimeter and extend away from the second face. When the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

3 Claims, 3 Drawing Sheets

(58) Field of Classification Search
USPC .................................................. 439/607.11
See application file for complete search history.

(56) References Cited

U.S. PATENT DOCUMENTS

| | | | |
|---|---|---|---|
| 7,322,854 B2* | 1/2008 | Long et al. | 439/607.28 |
| 7,357,675 B2* | 4/2008 | Barringer et al. | 439/607.3 |
| 7,473,139 B2* | 1/2009 | Barringer et al. | 439/607.17 |
| 7,727,018 B2* | 6/2010 | Bright et al. | 439/607.28 |
| 7,928,324 B2* | 4/2011 | Moore | 174/354 |
| 7,957,159 B2* | 6/2011 | Wu | 361/818 |
| 2004/0238195 A1* | 12/2004 | Thompson | 174/35 GC |
| 2007/0128936 A1* | 6/2007 | Long et al. | 439/607 |
| 2007/0212942 A1* | 9/2007 | Long | 439/608 |
| 2008/0060842 A1* | 3/2008 | Barringer et al. | 174/354 |
| 2008/0315528 A1* | 12/2008 | Moore | 277/314 |
| 2010/0266246 A1* | 10/2010 | van Haaster | 385/94 |

FOREIGN PATENT DOCUMENTS

| | | |
|---|---|---|
| WO | WO 2004-088381 | 10/2004 |
| WO | WO 2007-067496 | 6/2007 |
| WO | WO 2007-079117 | 7/2007 |

* cited by examiner

EMI GASKET

TECHNICAL FIELD

The present invention relates to electromagnetic interference ("EMI") gaskets, and more particularly to EMI gaskets intended for use with shielding cages that provide protection and shielding from electromagnetic interference.

BACKGROUND

It is a common practice to connect a cable to a printed circuit board (PCB) by utilizing a plug connector at an end of the cable which is intended for insertion into an opposing mating connector. The mating connector is typically mounted 10 on the PCB placed within a housing of an electronic device. There may be other electronic modules mounted on the PCB. Each electronic module may emit electromagnetic interference ("EMI") that can interfere and negatively influence the signals transmission between the connectors.

The mating connector may be shielded from EMI by using a metal shielding cage (or sometimes referred to as EMI shielding cage) that is also mounted on the PCB and which surrounds the mating connector in the electronic device. The cage has an opening which opens to a faceplate. The opening defines an entrance leading towards the mating connector into which the plug connector is inserted. However, even with the use of the cage, primarily at the area where the cage meets the PCB and around the opening of the faceplate into which the cage opening extends, EMI may still be present.

Conductive gaskets of various forms have been developed to address this problem. PCT Pat Publication No. 2004/088381 discloses an electrically conductive compressible gasket for a shielding cage with multiple module receiving bays. However, gaskets made using conductive foams are prone to tearing and other damage. The degree of EMI protection may be dependent on the amount of conductive material in the conductive foam.

For the benefit of consumers, standards have been established within the electronics industry, especially in the areas of connector mechanical interfaces, signal and data transmission protocols, and signal and data exchange protocols. This interoperability will allow an electronic module that is made by one vendor to be replaceable with a similar module from another vendor. Thus, consumers will have more product choices and can benefit from this competition with more competitive device pricing.

In the electronics industry, there are many standards committees including but not limited to, the Institute of Electric and Electronic Engineers ("IEEE") Committee which governs the specifications for data communication, the T10 Committee which defines the standards for data storage, and the Small Form Factor ("SFF") Committee which specifies the standards for mechanical interfaces for connectors. SFF 8088 is one such standard set by the SFF Committee and it is a specification for mini multi-lane shielded connectors.

For reasons provided earlier, there is motivation for manufacturers to use conductive metallic gaskets instead of conductive foam gaskets for EMI shielding for their electronic devices. PCT Patent Publication No. 2007/079117 discloses an EMI shroud with bidirectional contact members. At this moment, the use of a conductive metallic gasket would cause the connectors to be non SFF 8088-compliant.

SUMMARY

It would be desirable to provide a gasket that has good EMI shielding and, when in use together with an EMI shielding cage, allows a mating connector to remain SFF 8088-compliant.

In accordance with one embodiment of the present invention, there is provided a gasket for use with an electromagnetic interference (EMI) shielding cage for a connector. The gasket comprises a conductive body having an opening configured to receive a first end of the EMI shielding cage near a gasket mating wall that is incorporated on the EMI shielding cage. The conductive body comprises a first face designed to face away from the gasket mating wall, a second face designed to face the gasket mating wall, an inner perimeter and an outer perimeter. A plurality of engagement tabs are disposed along the outer perimeter and extend away from the first face. A plurality of spring tabs are disposed along the inner perimeter and extend away from the second face. When the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

In accordance with another embodiment of the present invention, there is provided an electromagnetic interference (EMI) shielding cage assembly with an EMI shielding cage and a gasket for use with the EMI shielding cage. The EMI shielding cage comprises a housing having a top panel, a back panel, two side panels and at least one slot configured at a first end of the EMI shielding cage. The EMI shielding cage provides an enclosure for EMI shielding for at least one connector when in use. The gasket comprises a conductive body having an opening configured to receive the first end of the EMI shielding cage near a gasket mating wall incorporated on the EMI shielding cage. The conductive body comprises a first face designed to face away from the gasket mating wall, a second face designed to face the gasket mating wall, an inner perimeter and an outer perimeter. The gasket further include a plurality of engagement tabs disposed along the outer perimeter which extend away from the first face and a plurality of spring tabs disposed along the inner perimeter which extend away from the second face. When the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

The invention further includes any alternative combination of parts or features mentioned herein or shown in the accompanying drawings. Known equivalents of these parts or features which are not expressly set out are nevertheless deemed to be included.

BRIEF DESCRIPTION OF THE DRAWINGS

An exemplary form of the present invention will now be described with reference to the accompanying drawings in which.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Figure 1:
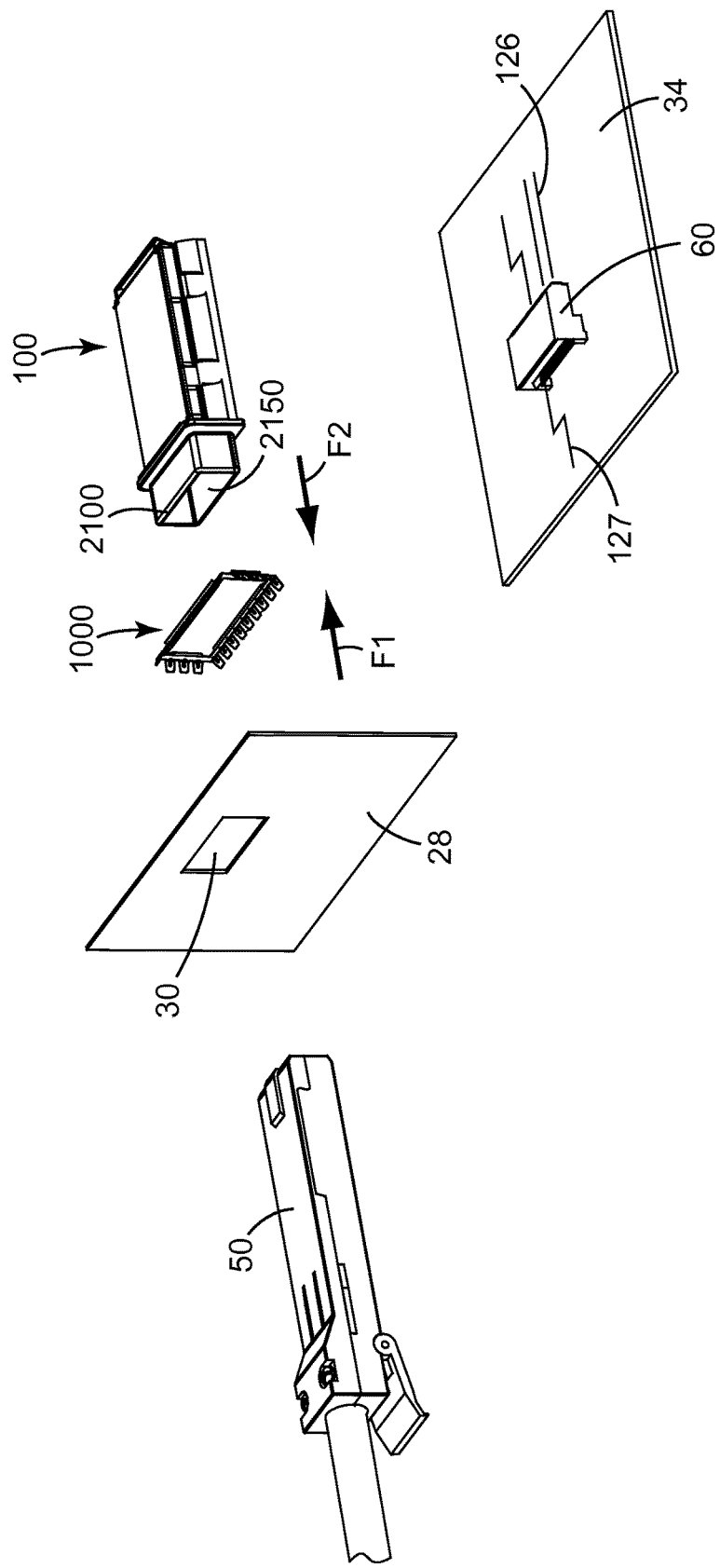
FIG. 1 shows an exemplary electromagnetic interference ("EMI") shielding cage in accordance with an aspect of the present invention, along with other devices that may be present when the EMI shielding cage is in use.

FIG. 1 shows a perspective view of one embodiment of an electromagnetic interference ("EMI") shielding cage 100 in accordance with an aspect of the present invention. The EMI shielding cage 100 is used for housing an electronic module. The electronic module which includes and is not limited to, a plug connector 50, may be used to provide a connection between signal traces 126 on a printed circuit board ("PCB") 34 and another electronic device (not shown). Such plug connectors are used commonly in data transmission servers and routers, for example. The plug connector 50 is plugged into an individual slot 2150 of the EMI shielding cage 100 wherein a mating connector 60 is mounted to the PCB 34. The EMI shielding cage 100 has an opening at a first end 2100 that communicates with the exterior of a device (not shown), preferably through an optional complementary faceplate 28 of the device. The EMI shielding cage 100 is used to shield the connectors from external electromagnetic waves, as well as to contain electromagnetic waves emanating from the connectors.

Figure 2:
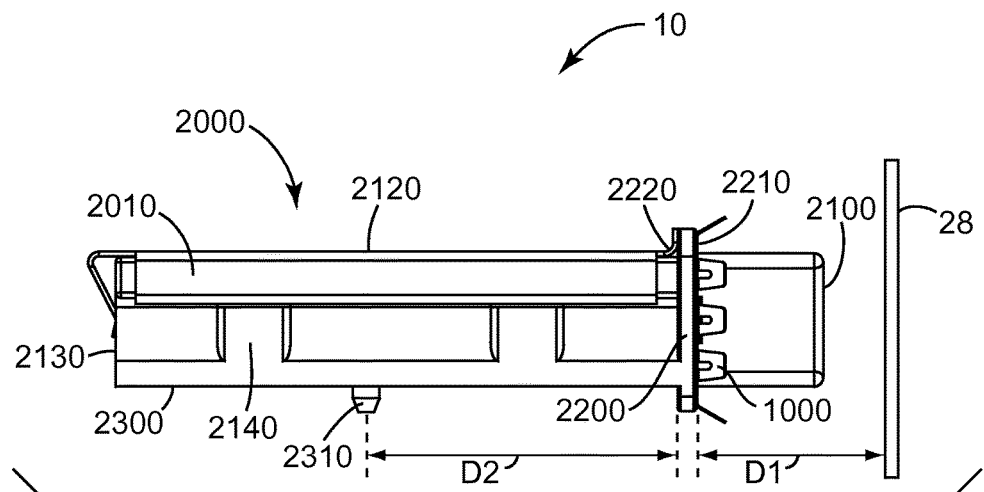
FIG. 2 shows a side view of one embodiment of an EMI shielding cage assembly in accordance with an aspect of the present invention.

FIG. 2 shows a side view of one embodiment of an EMI shielding cage assembly 10 in accordance with an aspect of the present invention. The EMI shielding cage assembly 10 comprises an EMI shielding cage 2000 and a gasket 1000. The EMI shielding cage 2000 comprises a housing 2010 constructed from electrically conductive panels typically formed from sheet metal. The housing 2010 has an opening at a first end 2100 of the EMI shielding cage 2000 into which the plug connector 50 will be inserted before engaging the mating connector 60. A gasket mating wall 2200 incorporated on the housing 2010 is configured near the first end 2100 of the housing 2010.

The electrically conductive panels comprise a bottom panel 2300, a back panel 2130, a pair of side panels 2140 and a top panel 2120, all of which are referred to herein as "exterior" panels of the EMI shielding cage 2000. In a preferred embodiment, the top panel 2120 can define a cover portion of the EMI shielding cage 2000 while the bottom panel 2300, the back panel 2130 and the side panels 2140 cooperatively define a base portion of the EMI shielding cage 2000.

Although a two-portion cage is shown for the purpose of illustration, it will be understood that the exterior panels may all be formed together from a single piece of sheet metal. Those of ordinary skill in the art of sheet metal fabrication will recognize that the various exterior panels can be readily formed by bending a single, appropriately-sized sheet metal panel. In various equivalent alternate embodiments, the various exterior panels 2300, 2130, 2140 and 2120 can also be formed from one or more individually-stamped panels that are assembled into the EMI shielding cage 2000. Another embodiment may include the electrically conductive bottom panel 2300 replaced by a conductive layer of copper for instance, on the top surface of the PCB 34 to which the EMI shielding cage 2000 would be attached.

When in use, the opening at the first end 2100 of the EMI shielding cage 2000 is aligned with an opening 30 (as shown in FIG. 1) of the optional complementary faceplate 28 of the device. It is through the opening 30 that the first end 2100 of the EMI shielding cage 2000 will pass through and be ready to receive the plug connector 50. Since the optional complementary faceplate 28 is typically electrically conductive, it may provide some form of EMI suppression for the connectors. The optional complementary faceplate 28 is sized and shaped such that the opening 30 encircles a portion of the bottom panel 5 2300, the side panels 2140 and the top panel 2120. However, the dimensions of the opening 30 of the optional complementary faceplate 28 do not normally allow for a tight mechanical and electrical connection between the optional complementary faceplate 28 and the exterior panels of the EMI shielding cage 2000. The improved electrical connection between the optional complementary faceplate 28 and the exterior panels may be provided by the gasket 1000 that is disposed on a first side 2210 of the gasket mating wall 2200 at a predefined separation distance D1 behind the optional complementary faceplate 28 as shown in FIG. 2.

In one embodiment, the base portion of the housing 2010 of the EMI shielding cage 2000 is electrically and mechanically coupled to the cover portion of the EMI shielding cage 2000 and the bottom panel 2300 of the base portion be connected to a ground potential via conductive ground traces 127 (as shown in FIG. 1) that exist on or within the PCB 34 on which the EMI shielding cage 2000 is disposed.

In one embodiment, at least one locating post 2310 is configured on the bottom panel 2300 at a distance D2 away from a second side 2220 of the gasket mating wall 2200. The locating post 2310 aids the alignment of the EMI shielding cage 2000 on the PCB 34 when in use so that the EMI shielding cage 2000 may be properly grounded via the conductive ground traces 127 on the PCB 34. Preferably, the distance D2 is within the range of about 18.04 millimeters to about 18.14 millimeters which thereby would make the connectors be compliant to industry standards such as SFF 8088.

Figure 3:
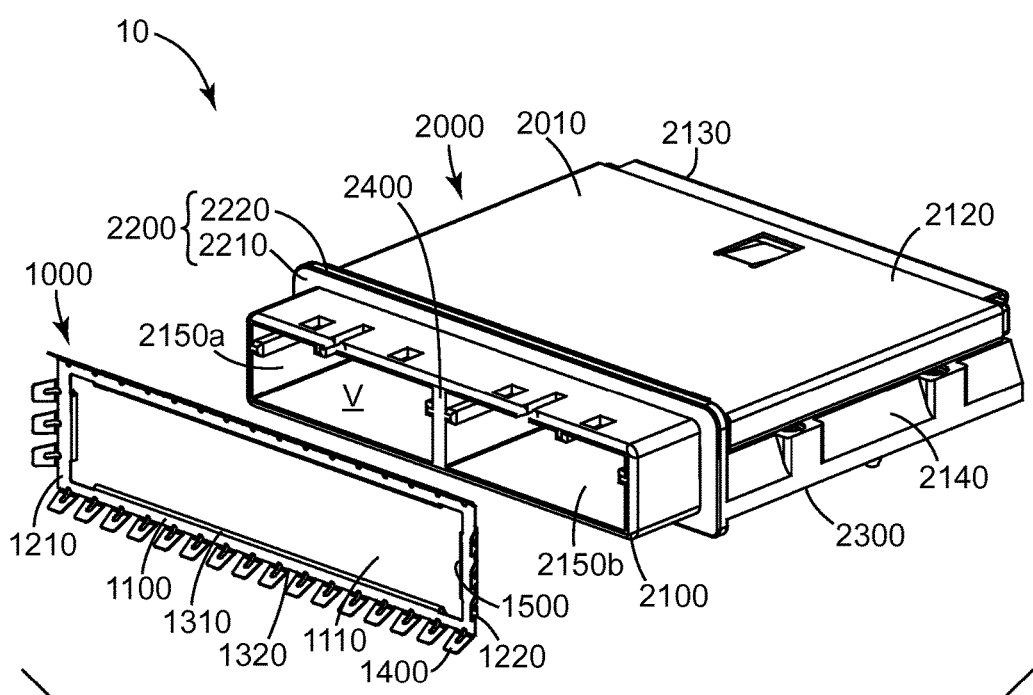
FIG. 3 shows a perspective view of the EMI shielding cage assembly in FIG. 2.

FIG. 3 shows a perspective view of the EMI shielding cage assembly 10. The exterior panels 2300, 2130, 2140 and 2120 of the EMI shielding cage 2000 enclose a volume V which is accessible via the first end 2100 of the EMI shielding cage 2000. It is possible that an EMI shielding cage may enclose more than one mating connectors. In such a situation, it is then preferred that the connectors be isolated and shielded from each other to minimize cross-interference within the EMI shielding cage 2000. In the exemplary embodiment illustrated by FIG. 3, a separation wall 2400 is configured within the EMI shielding cage 2000 with portions (not shown) of the separation wall 2400 in contact with the top panel 2120, bottom panel 2300 and the back panel 2130. As a result, the volume V is separated into two separate bays 2150a and 2150b. Preferably, only one mating connector 60 is housed in one bay. Accordingly, if more mating connectors are to be housed in the EMI shielding cage 2000, more separation walls 2400 would then need to be configured so as to provide sufficient isolated bays to house each individual mating connector.

For the benefit of consumers, standards have been established within the electronics industry, including in the areas of connector mechanical interfaces, signal and data transmission protocols, and signal and data exchange protocols. This interoperability will allow an electronic module that is made by one vendor be replaceable with a similar module from another vendor. Thus, consumers will have more product choices and can benefit from this competition with more competitive device pricing.

In the electronics industry, there are many standards committees including but not limited to, the Institute of Electric and Electronic Engineers ("IEEE") Committee which governs the specifications for data communication, the T10 Committee which defines the standards for data storage, and the Small Form Factor ("SFF") Committee which specifies the standards for mechanical interfaces for connectors. SFF 8088 is one such standard set by the SFF Committee and it is a specification for mini multi-lane shielded connectors.

Figure 4:
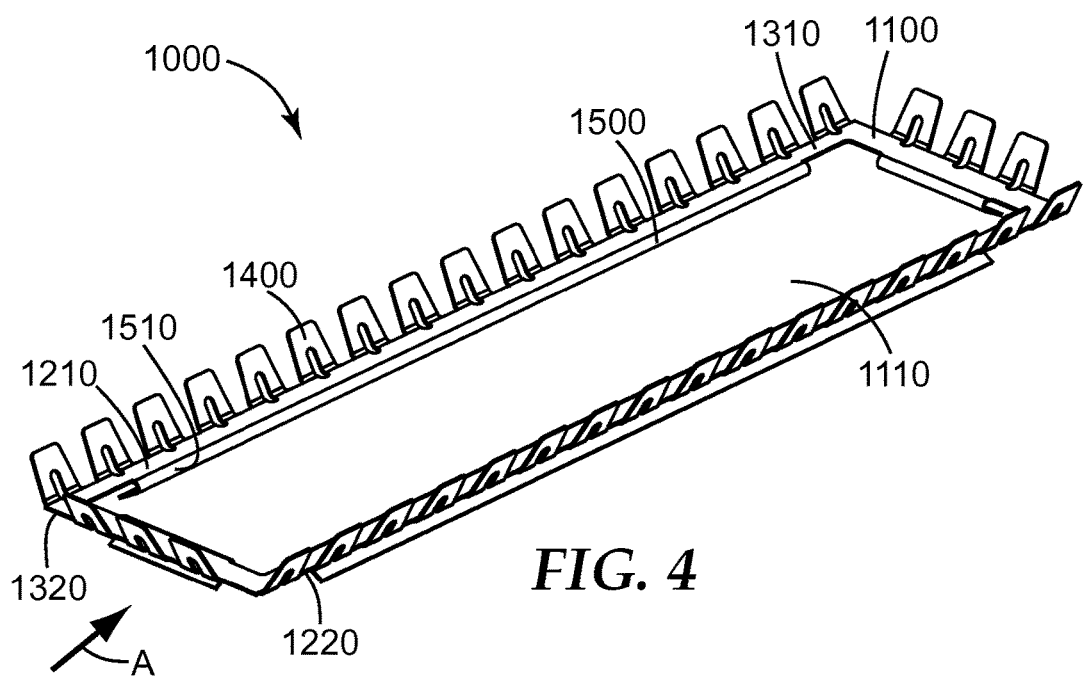
FIG. 4 shows a perspective view of one embodiment of an EMI gasket in accordance with an aspect of the present invention.
Figure 5:
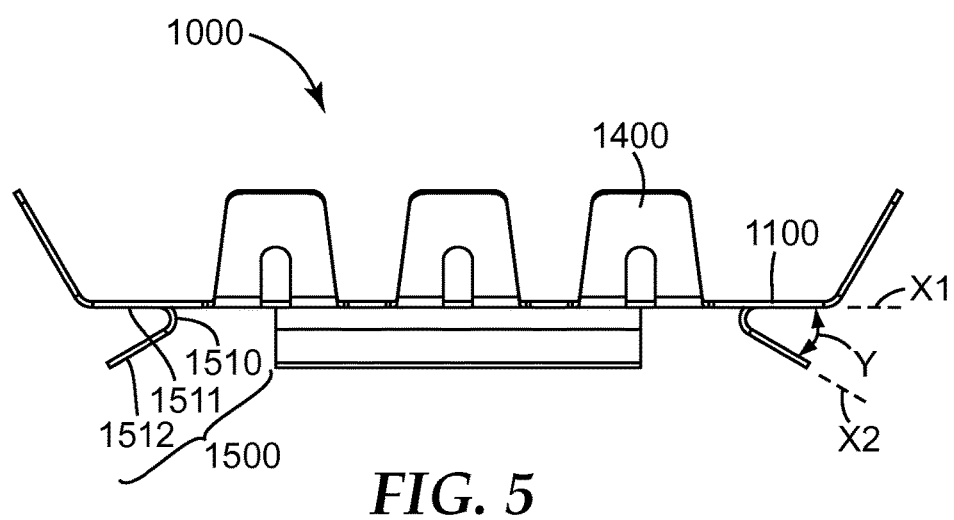
FIG. 5 shows a close-up side view of the EMI gasket in FIG. 4 taken from the direction of arrow A.

The area between the optional complementary faceplate 28 and the EMI shielding cage 2000 is prone to the discharge or leakage of electromagnetic emissions during high speed data transfer that can cause EMI. Provided in accordance with an aspect of the present invention and illustrated by FIGS. 3, 4 and 5, is an exemplary EMI gasket 1000 which when used with the EMI shielding cage 2000 would shield the mating connector 60 (not shown) housed in the EMI shielding cage 2000 from EMI and allow the connectors to remain SFF 8088-compliant.

The gasket 1000 is formed from a conductive metal such as stainless steel but it may also be formed from a plastic or other resilient material and coated with a conductive plating on its exterior surfaces. The gasket 1000 comprises a conductive body 1100 having a plurality of sides which are preferably interconnected to form a continuous structure. The gasket 1000 has an opening 1110 configured to receive the first end 2100 of the EMI shielding cage 2000 therein. The conductive body 1100 comprises a first face 1210, a second face 1220, an inner perimeter 1310 and an outer perimeter 1320. The conductive body 1100 further comprises a plurality of engagement tabs 1400 disposed along the outer perimeter 1320 and extending away from the first face 1210 and a plurality of spring tabs 1500 disposed along the inner perimeter 1310 and extending away from the second face 1220.

When in use, the engagement tabs 1400 and the spring tabs 1500 provide points of electrical engagement between the EMI shielding cage 2000, the gasket 1000 and the optional complementary faceplate 28.

When in use, the engagement tabs 1400 are in contact with the optional complementary faceplate 28 while the spring tabs 1500 are in contact with the gasket mating wall 2200, and the engagement tabs 1400 and the spring tabs 1500 cooperatively maintain a predefined separation distance D1 between the optional complementary faceplate 28 and the gasket mating wall 2200. In one embodiment in accordance with an aspect of the present invention, the separation distance D1 is within the range of about 1.13 millimeters to about 2.13 millimeters which thereby would make the connectors to be SFF 8088-compliant.

Functionally, the engagement tabs 1400 serve to provide good EMI dissipation while the spring tabs 1500 serve to provide structural support and strength for the gasket 1000 as the gasket 1000 is compressed between the optional complementary faceplate 28 and the gasket mating wall 2200 when the gasket 1000 is in use.

In one embodiment in accordance with an aspect of the present invention, as illustrated in FIG. 4, each engagement tab 1400 is isolated from the other and individually extends from the conductive body 1100. This provides multiple pathways for the EMI to be drained to ground.

In another embodiment in accordance with another aspect of the present invention, the spring tab 1500 of the gasket 1000 comprises a first section 1511 configured to couple the spring tab 1500 to the gasket 1000, a second section 1512 configured to be in contact with the gasket mating wall 2200 when in use and a kink 1510 connecting the first section 1511 to the second section 1512. The first section 1511 of the spring tab 1500 is aligned along a first axis X1 while the second section 1512 of the spring tab 1500 is aligned along a second axis X2. Preferably, the conductive body 1000 is aligned along the first axis X1 as the first section 1511 of the spring tab 1500. This provides structural support and strength to the coupling of the spring tab 1500 to the gasket 1000.

In one embodiment in accordance with another aspect of the present invention, the second axis X2 is at an angle Y to the first axis X1. The separation distance D1 between the optional complementary faceplate 28 and the gasket mating wall 2200 may be adjusted by changing a variety of parameters, including but not limited to, the flexibility of the engagement tabs 1400 and the spring tabs 1500 as well as the preset angle Y between the first axis X1 and the second axis X2 before use. When in use, the optional complementary faceplate 28 exerts a force F1 on the engagement tabs 1400 of the gasket 1000 in the direction towards the gasket mating wall 2200 of the EMI shielding cage 2000. In return, the gasket mating wall 2200 exerts an opposite force F2 on the spring tabs 1500 of the gasket 1000. The differential force of F1 and F2 which is affected by parameters stated above, will determine the distance by which the optional complementary faceplate 28 may travel towards the gasket mating wall 2200 which therefore determines the resulting separation distance D1.

Following are exemplary embodiments of a gasket for use with an electromagnetic interference (EMI) shielding cage for a connector and an electromagnetic interference (EMI) shielding cage assembly according to aspects of the present invention.

Embodiment 1 is a gasket for use with an electromagnetic interference (EMI) shielding cage for a connector, the gasket comprising: a conductive body having an opening configured to receive a first end of the EMI shielding cage near a gasket mating wall incorporated on the EMI shielding cage, wherein the conductive body comprises a first face designed to face away from the gasket mating wall, a second face designed to face the gasket mating wall, an inner perimeter and an outer perimeter; a plurality of engagement tabs disposed along the outer perimeter and extending away from the first face; and a plurality of spring tabs disposed along the inner perimeter and extending away from the second face wherein when the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

Embodiment 2 is the gasket of embodiment 1 wherein the predefined separation distance D1 is about 1.13 millimeters to about 2.13 millimeters.

Embodiment 3 is the gasket of one of the preceding embodiments 1 to 2 wherein the spring tab further comprises a first section configured to couple the spring tab to the gasket, a second section configured to be in contact with the gasket mating wall when in use and a kink connecting the first section to the second section.

Embodiment 4 is the gasket of embodiment 3 wherein the first section of the spring tab is aligned along a first axis and the second section of the spring tab is aligned along a second axis.

Embodiment 5 is an electromagnetic interference (EMI) shielding cage assembly comprising: an EMI shielding cage comprising a housing having a top panel, a back panel, two side panels and at least one slot configured at a first end of the EMI shielding cage providing an enclosure for EMI shielding for at least one connector when in use; a gasket for use with the EMI shielding cage, the gasket comprising: a conductive body having an opening configured to receive the first end of the EMI shielding cage near a gasket mating wall incorporated on the EMI shielding cage, wherein the conductive body comprises a first face designed to face away from the gasket mating wall, a second face designed to face the gasket mating wall, an inner perimeter and an outer perimeter; a plurality of engagement tabs disposed along the outer perimeter and extending away from the first face; and a plurality of spring tabs disposed along the inner perimeter and extending away from the second face wherein when the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

Embodiment 6 is the EMI shielding cage assembly of embodiment 5 wherein the predefined separation distance D1 is about 1.13 millimeters to about 2.13 millimeters.

Embodiment 7 is the EMI shielding cage assembly of embodiment 5 or embodiment 6 wherein the spring tab further comprises a first section configured to couple the spring tab to the gasket, a second section configured to be in contact with the gasket mating wall when in use and a kink connecting the first section to the second section.

Embodiment 8 is the EMI shielding cage assembly of embodiment 7 wherein the first section of the spring tab is aligned along a first axis and the second section of the spring tab is aligned along a second axis.

Embodiment 9 is the EMI shielding cage assembly of one of the preceding embodiments 5 to 8 wherein the EMI shielding cage further comprises a bottom panel coupled to the housing and the EMI shielding cage is grounded by connecting the bottom panel to a plurality of ground traces on a printed circuit board when in use.

Embodiment 10 is the EMI shielding cage assembly of embodiment 9 wherein the bottom panel further comprises a pair of locating posts.

Embodiment 11 is the EMI shielding cage assembly of embodiment 10 wherein a distance D2 between the second side of the gasket mating wall and the locating posts is about 18.04 millimeters to about 18.14 millimeters.

The foregoing description of the preferred embodiment of the invention has been presented for purposes of illustration and description. It is not intended to be exhaustive or to limit the invention to the precise forms disclosed, since many modifications or variations thereof are possible in light of the above teaching. All such modifications and variations are within the scope of the invention. The embodiments described herein were chosen and described in order to best explain the principles of the invention and its practical application, thereby to enable others skilled in the art to utilize the invention in various embodiments and with various modifications as are suited to the particular use contemplated thereof. It is intended that the scope of the invention be defined by the claims appended hereto, when interpreted in accordance with the full breadth to which they are legally and equitably suited.

What is claimed is:

1. A gasket for use with an electromagnetic interference (EMI) shielding cage for a connector, the gasket comprising:
   a conductive body having an opening configured to receive a first end of the EMI shielding cage near a gasket mating wall incorporated on the EMI shielding cage, wherein the conductive body comprises a first face designed to face away from the gasket mating wall, a second face designed to face the gasket mating wall, an inner perimeter and an outer perimeter;
   a plurality of engagement tabs disposed along the outer perimeter and extending away from the first face; and
   a plurality of spring tabs disposed along the inner perimeter and extending away from the second face wherein when the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

2. The gasket of claim 1 wherein the spring tab further comprises a first section configured to couple the spring tab to the gasket, a second section configured to be in contact with the gasket mating wall when in use and a kink connecting the first section to the second section.

3. An electromagnetic interference (EMI) shielding cage assembly comprising:
   an EMI shielding cage comprising a housing having a top panel, a back panel, two side panels and at least one slot configured at a first end of the EMI shielding cage providing an enclosure for EMI shielding for at least one connector when in use;
   a gasket for use with the EMI shielding cage, the gasket comprising:
   a conductive body having an opening configured to receive the first end of the EMI shielding cage near a gasket mating wall incorporated on the EMI shielding cage, wherein the conductive body comprises a first face designed to face away from the gasket mating wall, a second face designed to face the gasket mating wall, an inner perimeter and an outer perimeter;
   a plurality of engagement tabs disposed along the outer perimeter and extending away from the first face; and
   a plurality of spring tabs disposed along the inner perimeter and extending away from the second face wherein when the first end of the EMI shielding cage is inserted into the opening of the conductive body and an opening of an optional complementary faceplate with the engagement tabs facing the faceplate and the spring tabs facing the gasket mating wall of the EMI shielding cage, the engagement tabs and the spring tabs cooperatively maintain a predefined separation distance D1 between the gasket mating wall and the optional complementary faceplate.

\* \* \* \* \*